(12) United States Patent
Ruan et al.

(10) Patent No.: US 12,306,416 B2
(45) Date of Patent: May 20, 2025

(54) DISPLAY DEVICE AND METHOD FOR FABRICATING DISPLAY DEVICE

(71) Applicants: Beijing BOE Optoelectronics Technology Co., Ltd., Beijing (CN); BOE Technology Group Co., Ltd., Beijing (CN)

(72) Inventors: Yiping Ruan, Beijing (CN); Dongjia Hao, Beijing (CN); Zhonghua Li, Beijing (CN); Shipeng Wang, Beijing (CN); Shaofei Guo, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 262 days.

(21) Appl. No.: 18/031,004

(22) PCT Filed: Oct. 10, 2020

(86) PCT No.: PCT/CN2020/120204
§ 371 (c)(1),
(2) Date: Apr. 9, 2023

(87) PCT Pub. No.: WO2022/073235
PCT Pub. Date: Apr. 14, 2022

(65) Prior Publication Data
US 2023/0380252 A1    Nov. 23, 2023

(51) Int. Cl.
*H05K 7/20*      (2006.01)
*G02B 27/30*    (2006.01)
(Continued)

(52) U.S. Cl.
CPC ......... *G02B 27/30* (2013.01); *G06V 40/1318* (2022.01); *H05K 7/20963* (2013.01);
(Continued)

(58) Field of Classification Search
CPC .... G02B 27/30; G02B 5/208; G06V 40/1318; G06V 40/1329; H05K 7/20963;
(Continued)

(56) References Cited

U.S. PATENT DOCUMENTS

2018/0151641 A1*   5/2018   Choo ................... H04M 1/0266
2019/0197282 A1*   6/2019   Gong ................. G06V 40/1329
(Continued)

FOREIGN PATENT DOCUMENTS

CN    108962025 A      12/2018
CN    109147569 A *   1/2019  ......... G06V 40/1324
(Continued)

*Primary Examiner* — Zhengfu J Feng
(74) *Attorney, Agent, or Firm* — IPro, PLLC

(57) ABSTRACT

A display device and a manufacturing method thereof, the display device includes: a display panel having a display surface and a back surface opposite to each other; the heat dissipation film is attached to the back face of the display panel, and the heat dissipation film has an opening area; the flexible fingerprint recognition component is located on the side, away from the display panel, of the heat dissipation film. The flexible fingerprint recognition component includes a fingerprint recognition component in the opening area and a flexible heat dissipation component on the side, away from the display panel, of the fingerprint recognition component. The flexible heat dissipation component has a first portion covering the fingerprint identification component and a second portion extending from the first portion, and the second portion is in lap joint with the heat dissipation film on the edge of the windowing area.

17 Claims, 5 Drawing Sheets

(51) Int. Cl.
  *G06V 40/13* (2022.01)
  *H10K 59/65* (2023.01)
  *H10K 59/80* (2023.01)
  *H10K 59/90* (2023.01)
  *G02B 5/20* (2006.01)
(52) U.S. Cl.
  CPC ........... *H10K 59/65* (2023.02); *H10K 59/878* (2023.02); *H10K 59/879* (2023.02); *H10K 59/8792* (2023.02); *H10K 59/8794* (2023.02); *H10K 59/90* (2023.02); *G02B 5/208* (2013.01)
(58) Field of Classification Search
  CPC .... H10K 59/65; H10K 59/878; H10K 59/879; H10K 59/8792; H10K 59/8794; H10K 59/90; H10K 2102/311; G09F 9/00
  USPC ......................................................... 361/704
  See application file for complete search history.

(56) References Cited

U.S. PATENT DOCUMENTS

| 2019/0205593 | A1* | 7/2019 | Kim ..................... G06F 1/1696 |
| 2019/0205594 | A1 | 7/2019 | Lee et al. |
| 2019/0377925 | A1* | 12/2019 | Bae ........................ H01L 25/18 |
| 2020/0057522 | A1* | 2/2020 | Hong .................... G06F 1/1637 |
| 2020/0134278 | A1* | 4/2020 | Lee ....................... H05K 9/0054 |
| 2020/0265757 | A1 | 8/2020 | Zhang et al. |
| 2020/0287268 | A1* | 9/2020 | Moon ...................... H01Q 1/02 |
| 2021/0174048 | A1* | 6/2021 | Song ...................... G02B 17/08 |
| 2023/0267761 | A1* | 8/2023 | Chen .................. H04M 1/0266 |
| | | | 382/124 |

FOREIGN PATENT DOCUMENTS

| CN | 109273513 A | 1/2019 |
| CN | 109461374 A | 3/2019 |
| CN | 110059533 A | 7/2019 |
| CN | 111476055 A | 7/2020 |
| KR | 20190123859 A | 11/2019 |
| KR | 20200048286 A | 5/2020 |

* cited by examiner

DISPLAY DEVICE AND METHOD FOR FABRICATING DISPLAY DEVICE

CROSS REFERENCE TO RELATED APPLICATIONS

This application is a national phase entry under 35 U.S.C. § 371 of International Application No. PCT/CN2020/120204, filed on Oct. 10, 2020, the entire content of which is incorporated herein by reference.

FIELD

The disclosure relates to the field of semiconductors technology, in particular to a display apparatus and a method for fabricating the display apparatus.

BACKGROUND

Fingerprint recognition takes characteristics that each person's fingerprint skin pattern and detail features are different and unique to confirm whether a fingerprint collection object is a target object by comparing a fingerprint of the collection object with pre-saved fingerprint data. Single-finger fingerprint recognition in a fixed area has been widely used in cell phones, and this kind of fingerprint module is generally a rigid fingerprint recognition module. For an organic display screen, the use of the rigid fingerprint module is limited due to the curvature of such screen. For better user experience, a fingerprint module needs to cooperate with the organic display screen to achieve flexible large-area fingerprint recognition without fixing an area.

SUMMARY

An embodiment of the disclosure provides a display apparatus, including: a display panel including a display surface, and a back surface opposite to the display surface; a heat dissipation film, attached to the back surface of the display panel, the heat dissipation film having an opening area; and a flexible fingerprint recognition member on a side of the heat dissipation film facing away from the display panel. The flexible fingerprint recognition member includes: a fingerprint recognition component in the opening area, and a flexible heat dissipation component on a side of the fingerprint recognition component facing away from the display panel. The flexible heat dissipation component is provided with a first portion that covers the fingerprint recognition component, and a second portion that extends from the first portion, and the second portion overlaps the heat dissipation film at an edge of the opening area.

In some embodiments, in a direction perpendicular to the display surface, a thickness of the flexible fingerprint recognition member in the opening area is greater than a thickness of the heat dissipation film, and the first portion and the second portions are connected in a Z-shaped mode at the lap joint where the second portion overlaps the heat dissipation film.

In some embodiments, the flexible heat dissipation component includes: a copper foil, and a nano-carbon layer coated on a side of the copper foil facing the fingerprint recognition component.

In some embodiments, the fingerprint recognition component includes: a flexible substrate, a functional layer on a side of the flexible substrate facing away from the flexible heat dissipation component; and an optical filter film on a side of the functional layer facing away from the flexible substrate.

In some embodiments, the optical filter film is an infrared cutoff filter film, and the infrared cutoff filter film blocks light with a wavelength greater than 530 nanometers.

In some embodiments, the fingerprint recognition component further includes: a collimating structure on a side of the optical filter film facing away from the functional layer.

In some embodiments, the collimating structure includes a plurality of convex lenses distributed in an array, and a reflective layer on sides of the convex lenses facing the functional layer and having a plurality of via holes distributed in an array, the via holes are in one-to-one correspondence with the convex lenses, and the via hole and a center of the convex lens are located on a same straight line.

In some embodiments, the via hole is located in a focus of the corresponding convex lens.

In some embodiments, a projection of the convex lens on the flexible substrate is a hexagon.

In some embodiments, the fingerprint recognition component further includes: an optical clear adhesive between the collimating structure and the optical filter film.

In some embodiments, the fingerprint recognition component has a fingerprint recognition area, and a border area located on a periphery of the fingerprint recognition area. The fingerprint recognition component further includes: a frame adhesive on a side of the collimating structure facing the display panel, and the frame adhesive is located in the border area.

In some embodiments, the fingerprint recognition component further includes: a double-sided adhesive tape between the flexible heat dissipation component and the fingerprint recognition component, and the flexible heat dissipation component and the fingerprint recognition component are bonded through the double-sided adhesive tape.

In some embodiments, a projection of the first portion on the display surface is a rectangle, having a first side edge and a second side edge which are opposite, and a third side edge and a fourth side edge which are opposite; and the first side edge is bound with a first chip on film, and the fourth side edge is bound with a second chip on film. The second portion includes a first sub-heat dissipation portion extending from the second side edge, and a second sub-heat dissipation portion extending from the third side edge.

In some embodiments, the first chip on film is provided with a fingerprint recognition chip; and the second chip on film is provided with a gate driving chip; and the second chip on film is further bonded with a flexible circuit board.

In some embodiments, an area of the flexible fingerprint recognition member accounts for 40%-70% of an area of the display panel.

An embodiment of the disclosure further provides a method for fabricating the display apparatus provided by the embodiment of the disclosure, including: forming the flexible fingerprint recognition member; and attaching the flexible fingerprint recognition member to the opening area of the heat dissipation film on the back surface of the display panel. The forming the flexible fingerprint recognition member, includes: forming the fingerprint recognition component on a rigid substrate; stripping off the rigid substrate; and attaching a flexible heat dissipation component to a side of the fingerprint recognition component facing away from the display panel.

In some embodiments, the forming the fingerprint recognition component on the rigid substrate includes: forming a functional layer on a bonding structure, where, the bonding structure includes the rigid substrate, and a flexible substrate bonded to the rigid substrate; forming an optical filter film on a side of the functional layer facing away from the flexible substrate; bonding a collimating structure to a side of the optical filter film facing away from the flexible substrate through an optical clear adhesive; and bonding a first chip on film and a second chip on film.

DETAILED DESCRIPTION

In order to make objectives, technical solutions and advantages of embodiments of the disclosure clearer, the technical solutions of the embodiments of the disclosure will be clearly and completely described below in conjunction with accompanying drawings of the embodiments of the disclosure. Apparently, the described embodiments are only a part of the embodiments of the disclosure, not all of the embodiments. Based on the described embodiments of the disclosure, all other embodiments obtained by those ordinarily skilled in the art without creative work shall fall within the protection scope of the disclosure.

Unless otherwise indicated, technical or scientific terms used in the disclosure shall have the ordinary meanings understood by those ordinarily skilled in the art to which the disclosure pertains. The words "first", "second" and the like used in the disclosure do not indicate any order, quantity or importance, but are only used to distinguish different components. The words "comprise" or "include" or the like indicate that an element or item appearing before such words covers listed elements or items appearing after the words and equivalents thereof, and does not exclude other elements or items. The words "connect" or "couple" or the like are not limited to physical or mechanical connection, but may include electrical connection, whether direct or indirect. "Upper", "lower", "left", "right" and the like are only used to represent relative position relationships, and the relative position relationships may also change accordingly after an absolute position of a described object is changed.

In order to keep the following descriptions of the embodiments of the disclosure clear and concise, detailed descriptions of known functions and known components are omitted.

Figure 1:
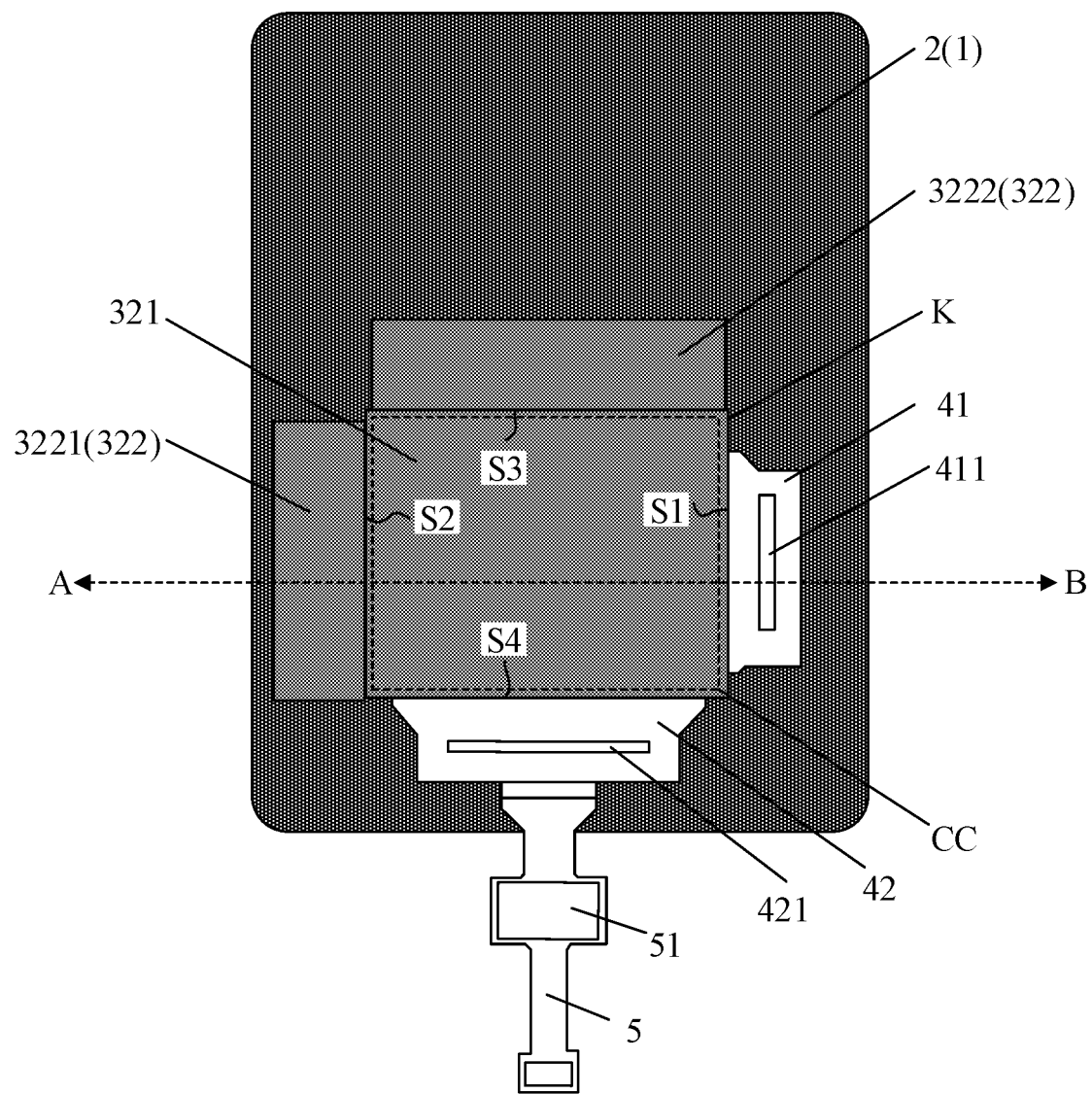
FIG. 1 is a schematic top view of a display apparatus provided by an embodiment of the disclosure.
Figure 2:
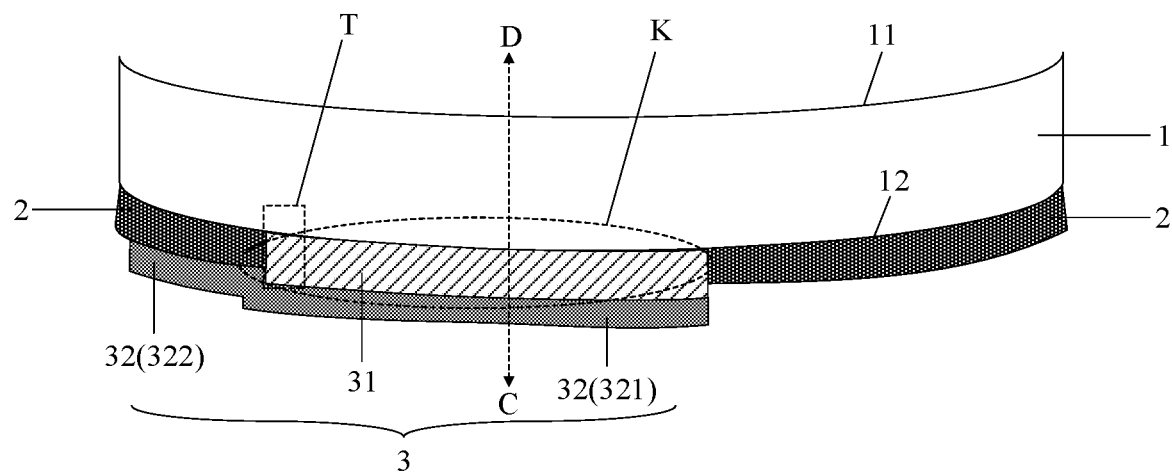
FIG. 2 is a schematic cross-sectional view of section along a dotted line in FIG. 1.
Figure 3:
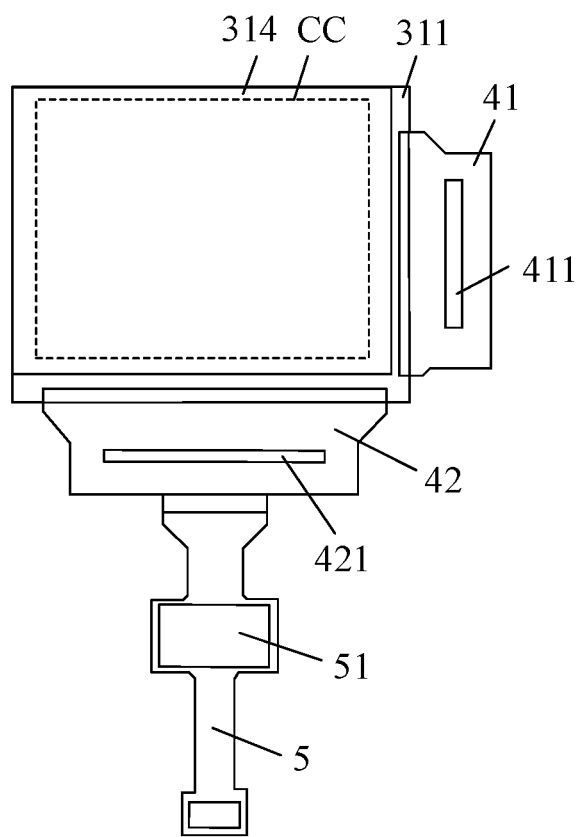
FIG. 3 is a schematic top view of a flexible fingerprint recognition member provided by an embodiment of the disclosure.

Referring to FIG. 1, FIG. 2 and FIG. 3, FIG. 2 is a schematic cross-sectional view of a section along a dotted line AB in FIG. 1, and FIG. 3 is a schematic structural diagram of a flexible recognition member. An embodiment the disclosure provides a display apparatus, including:
a display panel 1, provided with a display surface 11, and a back surface 12 opposite to the display surface 11;
a heat dissipation film 2, attached to the back surface 12 of the display panel 1, the heat dissipation film 2 having an opening area K; and
a flexible fingerprint recognition member 3, located on a side of the heat dissipation film 2 facing away from the display panel 1. The flexible fingerprint recognition member 3 includes: a fingerprint recognition component 31 located in the opening area K, and a flexible heat dissipation component 32 on a side of the fingerprint recognition component 31 facing away from the display panel 1. The flexible heat dissipation component 32 includes a first portion 321 that covers the fingerprint recognition component 31, and a second portion 322 extending from the first portion 321, where the second portion 322 overlaps the heat dissipation film 2 at edges of the opening area K.

In the embodiment of the disclosure, the flexible fingerprint recognition member is arranged on the back surface of the display panel, and includes the first portion that covers the fingerprint recognition component, and the second portion that extends from the first portion, where the second portions overlap a heat dissipation portion at the edges of the opening area. On the one hand, the flexible fingerprint recognition member is easy to bend, and may be surface-bonded and bent-bonded together with the curved display panel by using a soft-to-hard bonding technology, and the problem that in the prior art, a rigid fingerprint recognition member is limited in use and cannot achieve flexible large-area fingerprint recognition without a fixed area is improved. On the other hand, the second portions of the flexible heat dissipation component in the embodiment of the disclosure overlap the heat dissipation film at the edges of the opening area, which may make heat generated by the flexible fingerprint recognition member diffuse to the heat dissipation film in time, and may further improve the problem that a temperature will be too high and heat dissipation will be poor for long time use when realizing a large-area fingerprint recognition area.

In some embodiments, the display panel in the embodiment of the disclosure is the curved display panel shown in FIG. 2, and the curved display panel may be a curved display panel with curved edges or a curved display panel with an overall curved shape. The display panel may be an organic light-emitting display panel, the organic light-emitting display panel may include a base substrate, and a driving layer, a light-emitting device and an encapsulation layer which are sequentially disposed on a side of the base substrate. The driving layer may include a driving circuit driving the light-emitting device to emit light; and the light-emitting device may include an anode, a hole injection layer, a hole transfer layer, an organic light-emitting layer, an electron transfer layer, an electron injection layer and a cathode layer which are sequentially arranged.

In some embodiments, in a direction perpendicular to the display surface 11 (a direction along a dotted line CD in FIG. 2), a thickness of the flexible fingerprint recognition member 3 in the opening area K is greater than a thickness of the heat dissipation film 2, and the first portion 321 and the second portions 322 are connected in a Z-shaped mode at the lap joint. In the embodiment of the disclosure, for better heat dissipation, the first portion 321 and the second portions 322 are connected in the Z-shaped mode at the lap joint where the second portion 322 overlaps the heat dissipation film 2. With this structural design, the heat generated by the fingerprint recognition component 31 may be conducted to the heat dissipation film 2 via the flexible heat dissipation component 32 to prevent the area where the fingerprint recognition component 31 is located (an area shown by a dashed box CC in FIG. 1 or FIG. 4) from overheating and affecting the performance of the display panel as well as the fingerprint recognition component.

In some embodiments, the flexible heat dissipation component 32 includes: copper foil, and a nano-carbon layer coated on a side of the copper foil facing the fingerprint recognition component 31, and a nano-carbon copper layer is formed. The copper foil is used for heat conduction, and the heat from the area where the fingerprint recognition component is located is conducted to the heat dissipation film 2. A heat conductivity may be 400 W/m·K. The nano-carbon layer may perform radiation heat dissipation. In the embodiment of the disclosure, the flexible heat dissipation component 32 includes: the copper foil, and the nano-carbon layer coated on the side of the copper foil facing the fingerprint recognition component 31. The nano-carbon copper layer itself has a certain hardness and may be bent. A strength of the flexible substrate (such as a PI film) of the fingerprint recognition component is increased after attaching the nano-carbon copper layer, and the nano-carbon copper layer may play a role of protecting the functional layer of the fingerprint recognition component, and meanwhile, the nano-carbon copper layer may also play a role of heat dissipation for a collection area of the fingerprint recognition component. Specifically, the flexible substrate (such as the PI film) of the fingerprint recognition component and the nano-carbon copper layer may be bonded together through double-sided adhesive tape. A thickness of the nano-carbon copper layer may be 80 um-120 um; or, it may be 90 um-110 um; specifically, it may also be 95 um-105 um; or, it may be 96 um; or, it may be 98 um; or, it may also be 100 um.

Figure 4:
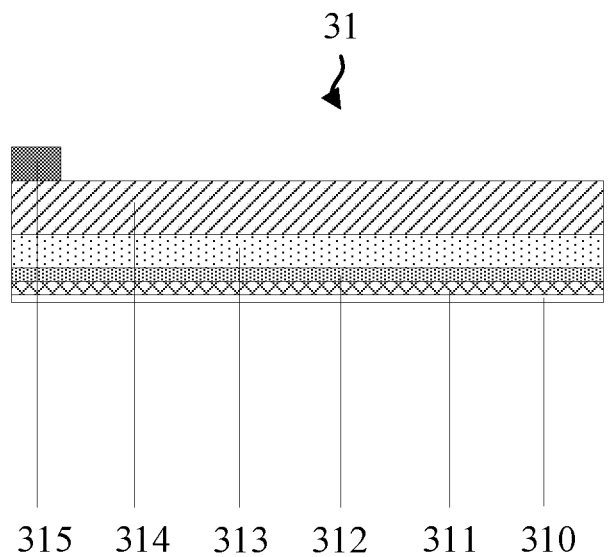
FIG. 4 is a schematic top view of a fingerprint recognition component provided by an embodiment of the disclosure.
Figure 5:
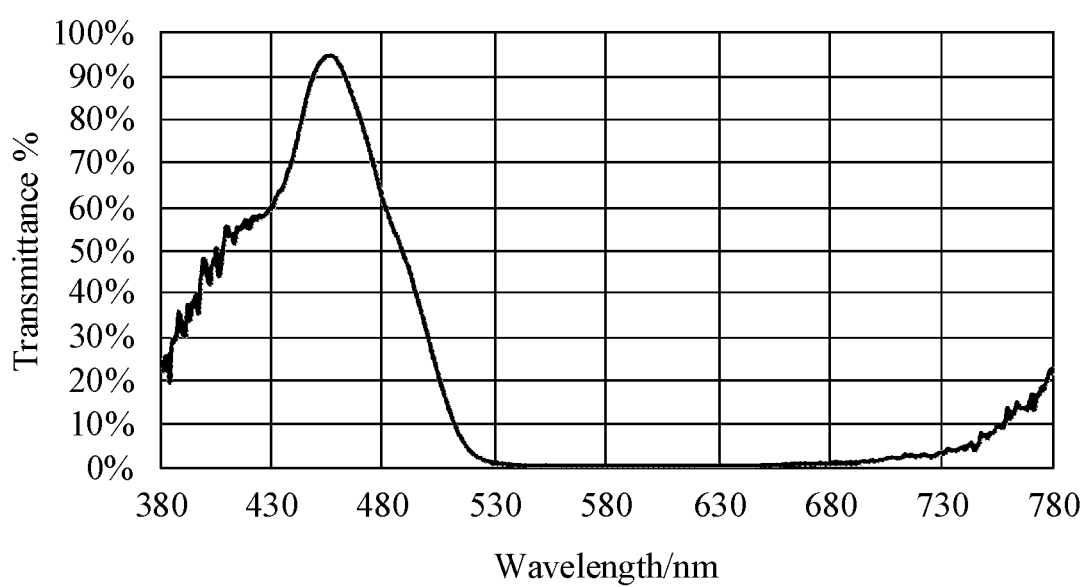
FIG. 5 is a schematic diagram of light transmittance of a fingerprint recognition component provided with an optical filter film provided by an embodiment of the disclosure.

In some embodiments, in conjunction with FIG. 2 and FIG. 4, FIG. 4 is an enlarged partial schematic diagram of the fingerprint recognition component in a dashed box T in FIG. 2. The fingerprint recognition component 31 includes: a flexible substrate 310, and a functional layer 311 on a side of the flexible substrate 310 facing away from the flexible heat dissipation component 32; and the fingerprint recognition component 31 further includes: an optical filter film 312 on a side of the functional layer 311 facing away from the flexible substrate 310. Specifically, the optical filter film 312 is an infrared cutoff filter film, and the infrared cutoff filter film blocks light with a wavelength greater than 530 nanometers. In the embodiment of the disclosure, the fingerprint recognition component 31 is coated with the infrared cutoff filter film on the functional layer 311, which may make the light with the wavelength greater than 530 nm blocked from entering the functional layer 311. The infrared cutoff filter film may reduce a large amount of light from entering the functional layer 311 and prevent a collected fingerprint image from overexposure due to too much light received by the functional layer 311. Based on testing, as shown in FIG. 5, under a strong light condition below 100 K LUX illumination, after adding the infrared cutoff filter film, infrared light with a greater wavelength cannot enter the functional layer 311, which may avoid overexposure of the fingerprint image and obviously improve a contrast of the fingerprint image.

Specifically, the functional layer 311 in the fingerprint recognition component 31 may specifically include a plurality of recognition units distributed in an array. Each recognition unit may include: a first electrode and a second electrode arranged oppositely, and a photosensitive film layer located between the first electrode and the second electrode and used for photoelectric conversion.

Figure 6:
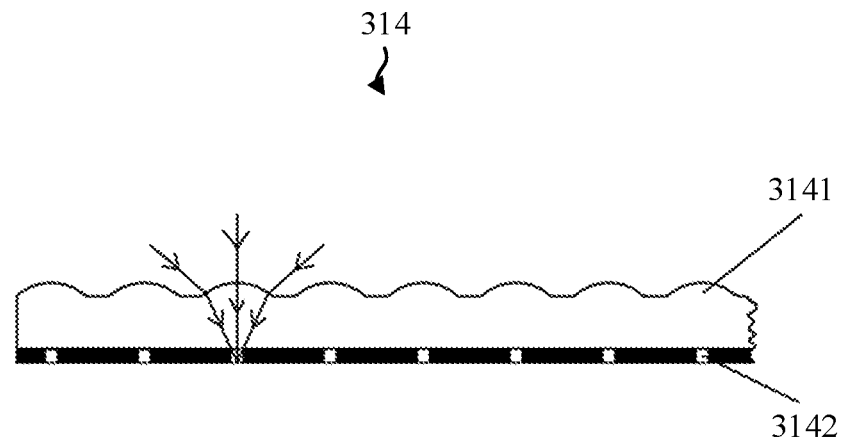
FIG. 6 is a schematic diagram of a collimating structure provided by an embodiment of the disclosure.
Figure 7:
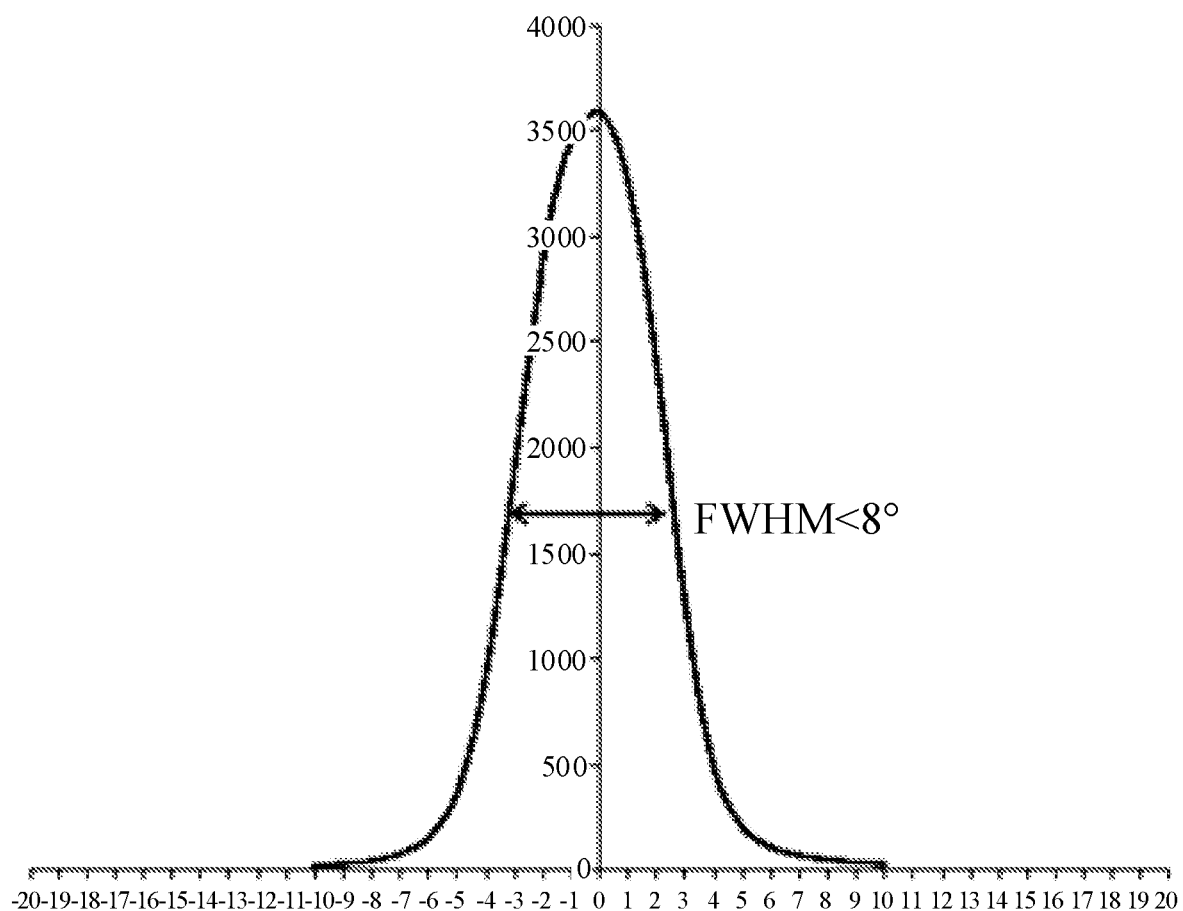
FIG. 7 is a schematic diagram of a divergence angle of light passing through a collimating structure provided by an embodiment of the disclosure.

In some embodiments, combined with FIG. 4 and FIG. 6, the fingerprint recognition component 3 further includes: a collimating structure 314 on a side of the optical filter film 312 facing away from the functional layer 311. Specifically, the collimating structure 314 includes a plurality of convex lenses 3141 distributed in an array, and a reflective layer on sides of the convex lenses 3141 facing the functional layer 311 and having a plurality of via holes 3142 distributed in an array, the via holes 3142 are in one-to-one correspondence with the convex lenses 3141, and the via holes 3142 and centers of the convex lenses 3141 are located on the same straight line. Specifically, the via holes 3142 are located in focuses of the corresponding convex lenses 3141. In the embodiment of the disclosure, by adjusting a total thickness of the collimating structure 314, positions of the via holes 3142 are in the focuses of the micro convex lenses 3141, light emitted from the display panel 1 is refracted by the micro convex lenses 3141 on the collimating structure 314, so that an angle of the light becomes smaller, and a view angle of light divergence is constrained to be less than 8° (shown in FIG. 7). The small-angle light passes through the transparent via holes 3142 and is then received by a photoelectric conversion functional layer in the functional layer 311, the light is collimated by the collimating structure 314, which may improve a resolution of fingerprint recognition, and large-angle light cannot pass through the tiny transparent via holes 3142 in the collimating structure 314 and is reflected back by the reflective layer, which may strengthen brightness of the display panel 1 in the area where the fingerprint recognition component 31 is located, so that the brightness of a fingerprint recognition area and a non-fingerprint recognition area of the display panel 1 will not be significantly different.

Specifically, a projection of the convex lens 3141 on the flexible substrate 310 is hexagon. The convex lens 3141 is of a hexagonal convex lens structure.

In some embodiments, in conjunction with FIG. 4, the fingerprint recognition component 31 further includes: an optical clear adhesive 313 between the collimating structure 314 and the optical filter film 312 so as to realize bonding of the collimating structure 314. Specifically, a thickness of the optical clear adhesive 313 may be 10 um-30 um; specifically, for example, it may be 15 um; or, for example, it may be 25 um.

In some embodiments, the fingerprint recognition component 31 has a fingerprint recognition area, and a border area located on a periphery of the fingerprint recognition area. In conjunction with FIG. 4, the fingerprint recognition component 31 further includes: a frame adhesive 315 on a side of the collimating structure 314 facing the display panel 1, and the frame adhesive 315 is located in the border area, so that the fingerprint recognition component 31 and the display panel 1 are bonded. Specifically, the frame adhesive may be in a concentric-square shape that surrounds the fingerprint recognition area.

In some embodiments, the fingerprint recognition component 31 further includes: double-sided adhesive tape between the flexible heat dissipation component 32 and the fingerprint recognition component 31, and the flexible heat dissipation component 32 and the fingerprint recognition component 31 are bonded through the double-sided adhesive tape.

In some embodiments, in conjunction with FIG. 1, a projection of the first portion 321 on the display surface is a rectangle, having a first side edge S1 and a second side edge S2 which are opposite, and a third side edge S3 and a fourth side edge S4 which are opposite; the first side edge S1 is bonded with a first chip on film 41, and the fourth side edge S4 is bonded with a second chip on film 42; and the second portion 322 includes a first sub-heat dissipation portion 3221 extending from the second side edge S2, and a second sub-heat dissipation portion 3222 extending from the third side edge S3. Specifically, the first sub-heat dissipation portion 3221 may be rectangular, an area of the first sub-heat dissipation portion 3221 may be one seventh to one third of an area of the first portion 321; and specifically, the area of the first sub-heat dissipation portion 3221 may be one quarter of the area of the first portion 321. Specifically, the second sub-heat dissipation portion 3222 may be rectangular, an area of the second sub-heat dissipation portion 3222 may be one seventh to one third of the area of the first portion 321; and specifically, the area of the second sub-heat dissipation portion 3222 may be one quarter of the area of the first portion 321.

In some embodiments, an area of the flexible fingerprint recognition member 3 accounts for 40%-70% of an area of the display panel 1. In the embodiment of the disclosure, the flexible fingerprint recognition member 3 and the display panel 1 are bonded and may be bent and folded, and at an edge position of the curved display panel, the flexible fingerprint recognition member 3 may be bent and bonded according to a curved surface of the display panel 1. The flexible fingerprint recognition member 3 is not affected by a bonding plane, and the fingerprint recognition area may be extended to the curved surface of the edge of the display panel 1, which increases the area of a fingerprint recognition module, so that the large-area fingerprint recognition of a half screen may be realized.

In some embodiments, in conjunction with FIG. 1, the first chip on film 41 is provided with a fingerprint recognition chip 411; the second chip on film 42 is provided with a gate driving chip 421; and the second chip on film 42 is further bonded with a flexible circuit board 5. An element 51 may further be arranged on the flexible circuit board 5.

In some embodiments, materials of the fingerprint recognition component 31, except for the peripheral fingerprint recognition chip 411, the gate driving chip 421, and the element 51, are flexible materials. Specifically, the functional layer 311 in the fingerprint recognition component 31 may be a flexible film layer.

Figure 8:
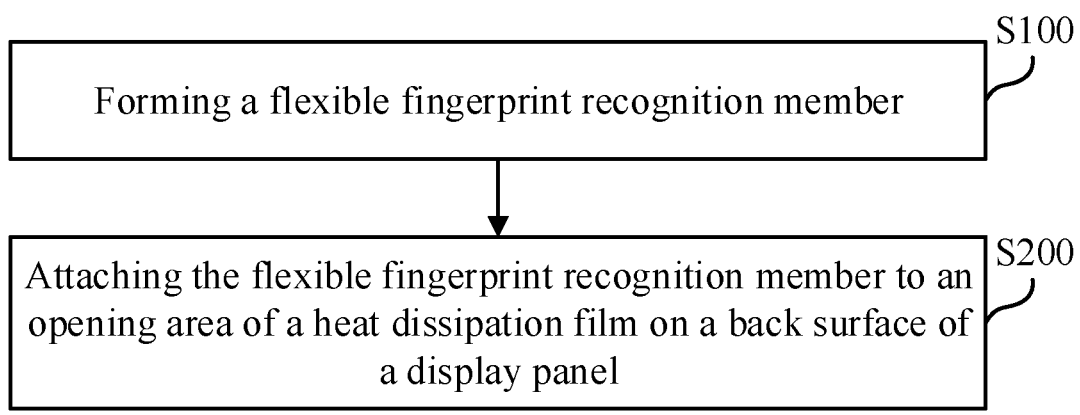
FIG. 8 is a schematic flow diagram of fabricating a display apparatus provided by an embodiment of the disclosure.

Based on the same inventive concept, an embodiment of the disclosure further provides a method for fabricating the display apparatus provided by the embodiment of the disclosure, referring to FIG. 8, including:

S100, forming a flexible fingerprint recognition member; and

S200, attaching the flexible fingerprint recognition member to an opening area of a heat dissipation film on a back surface of a display panel.

For S100, the forming the flexible fingerprint recognition member, includes:

S110, forming a fingerprint recognition component on a rigid substrate;

S120, stripping off the rigid substrate; and

S130, attaching a flexible heat dissipation component to a side of the fingerprint recognition component facing away from display panel.

In some embodiments, for S110, the forming the fingerprint recognition component on the rigid substrate includes:

S111, forming a functional layer on a bonding structure, where, the bonding structure includes the rigid substrate, and a flexible substrate bonded to the rigid substrate;

S112, forming an optical filter film on a side of the functional layer facing away from the flexible substrate;

S113, bonding a collimating structure to a side of the optical filter film facing away from the flexible substrate through an optical clear adhesive; and S114, bonding a first chip on film and a second chip on film.

In order to understand the method for fabricating the display apparatus provided by the embodiment of the disclosure more clearly, a further detailed description is provided as follows.

Step 1, the functional layer 311 of the fingerprint recognition component 31 is fabricated on the bonding structure of the flexible substrate (the PI film) and the rigid substrate (such as a glass substrate) using a thin film transistor process, specifically, it may be the PI film on the top and the glass substrate on the bottom, the glass substrate protects the PI film during a fabricating process, a wire of the functional layer 311 is on the flexible PI film surface, the glass substrate plays a role of protecting the trace on the PI film to prevent the trace from breaking due to bending or expanding of the PI film during the production process. The thickness of the PI film may be 15 um or 38 um, preferably 15 um, and the thickness of the protective glass substrate is generally 0.5 mm or 0.7 mm, preferably 0.7 mm.

Step 2, after fabricated, the large functional layer 311 is cut into small pieces of fingerprint recognition sensors.

Step 3, each small piece of fingerprint recognition sensor is plated with an infrared cutoff filter film, and light with the wavelength greater than 530 nm is blocked and cannot enter the sensor functional layer.

Step 4, the optical clear adhesive 313 (OCA) is used to bond the collimating structure 314 on the fingerprint recognition sensors, and the optical clear adhesive 313 between the collimating structure 314 and the fingerprint recognition sensors is a disposed all over the surface; the thickness of the collimating structure 314 is generally 56 um, and the thickness of the optical clear adhesive 313 is generally 25 um, 75 um or 100 um, etc., preferably 25 um; and the optical clear adhesive 313 is a multilayer film, the array of hexagonal convex lenses 3141 is above the optical clear adhesive 313, and the reflective layer with an array of the transparent via holes 3142 is below the optical clear adhesive 313.

Step 5, the first chip on film 41, the second chip on film 42 and the flexible circuit board 5 are bonded to the fingerprint recognition sensors.

Step 6, after a fingerprint recognition sensor semi-finished module is fabricated, the protective layer of glass substrate needs to be stripped off.

Step 7, after the protective layer of glass substrate is stripped off, the flexible heat dissipation component 32 (the nano-carbon copper layer) needs to be attached to the PI film, the nano-carbon copper layer plays a role of heat dissipation and protection of the PI film functional layer, and the PI film layer and the nano-carbon copper layer are bonded together by double-sided adhesive tape. The thickness of the nano-carbon copper layer is generally 50 um or 100 um, preferably 100 um.

The above is the fabricating process of the flexible ultra-thin optical flexible fingerprint recognition component, each layer of film material has the above various thicknesses to choose from, and choosing the smallest thickness may make the optical fingerprint module to achieve an ultra-thin effect. In order to make the image collected by the flexible fingerprint recognition member be high in contrast and to achieve the ultra-thin effect, the thickness of each layer may be: the frame adhesive 315 may be 25 um, the collimating structure 314 may be 56 µm, the optical clear adhesive 313 (OCA) may be 25 um, a sum of the thicknesses of flexible substrate 310 and the functional layer 311 may be 15 um, the optical filter film 312 (the infrared cutoff filter film) may be 5 um, the flexible heat dissipation component 32 (the nano-carbon copper layer) may be 100 um, and the total thickness of the flexible fingerprint recognition member 3 may be 226 um.

The beneficial effects of the embodiments of the disclosure are as follows: in the embodiments of the disclosure, the flexible fingerprint recognition member is arranged on the back surface of the display panel, and includes the first portion that covers the fingerprint recognition component, and the second portions that extend from the first portion, where, the second portions overlap the heat dissipation portion at the edges of the opening area. On the one hand, the flexible fingerprint recognition member is easy to bend, and may be surface-bonded and bent-bonded together with the curved display panel by using a soft-to-hard bonding technology, and the problem that in the prior art, a rigid fingerprint recognition member is limited in use and cannot achieve flexible large-area fingerprint recognition without a fixed area is improved. On the other hand, the second portions of the flexible heat dissipation component in the embodiments of the disclosure overlap the heat dissipation film at the edges of the opening area, which may make heat generated by the flexible fingerprint recognition member diffuse to the heat dissipation film in time, and may further improve the problem that a temperature will be too high and heat dissipation will be poor for long time use when realizing a large-area fingerprint recognition area.

Although the preferred embodiments of the disclosure have been described, those skilled in the art may make additional changes and modifications on these embodiments once they know the basic creative concept. So the appended claims are intended to be construed to include the preferred embodiments and all changes and modifications that fall into the scope of the disclosure.

Apparently, those skilled in the art may make various modifications and variations to the embodiments of the disclosure without departing from the spirit and scope of the embodiments of the disclosure. In this way, under the condition that these modifications and variations to the embodiments of the disclosure fall within the scope of the claims of the disclosure and their equivalent technologies, the disclosure is also intended to include these modifications and variations.

What is claimed is:

1. A display apparatus, comprising:
    a display panel, comprising a display surface and a back surface opposite to each other;
    a heat dissipation film, attached to the back surface of the display panel, wherein the heat dissipation film comprises an opening area; and
    a flexible fingerprint recognition member, disposed on a side of the heat dissipation film facing away from the display panel;
    wherein the flexible fingerprint recognition member comprises:
        a fingerprint recognition component in the opening area; and
        a flexible heat dissipation component on a side of the fingerprint recognition component facing away from the display panel;
    wherein the flexible heat dissipation component comprises:
        a first portion covering the fingerprint recognition component; and
        a second portion extending from the first portion, wherein the second portion overlaps the heat dissipation film at an edge of the opening area.

2. The display apparatus according to claim 1, wherein, in a direction perpendicular to the display surface, a thickness of the flexible fingerprint recognition member in the opening area is greater than a thickness of the heat dissipation film; and
    the first portion and the second portion are connected in a Z-shaped mode at a lap joint where the second portion overlaps the heat dissipation film.

3. The display apparatus according to claim 1, wherein, the flexible heat dissipation component comprises:
    copper foil; and
    a nano-carbon layer coated on a side of the copper foil facing the fingerprint recognition component.

4. The display apparatus according to claim 3, wherein, the fingerprint recognition component comprises:
    a flexible substrate;
    a functional layer on a side of the flexible substrate facing away from the flexible heat dissipation component; and
    an optical filter film on a side of the functional layer facing away from the flexible substrate.

5. The display apparatus according to claim 4, wherein, the optical filter film is an infrared cutoff filter film, and the infrared cutoff filter film blocks light with a wavelength greater than 530 nanometers.

6. The display apparatus according to claim 4, wherein, the fingerprint recognition component further comprises:
    a collimating structure on a side of the optical filter film facing away from the functional layer.

7. The display apparatus according to claim 6, wherein, the collimating structure comprises:
    a plurality of convex lenses distributed in an array; and
    a reflective layer on sides of the convex lenses facing the functional layer and comprising a plurality of via holes distributed in an array;
    wherein the via holes are in one-to-one correspondence with the convex lenses, and one of the via holes and a center of a corresponding one of the convex lenses are located on a same straight line.

8. The display apparatus according to claim 7, wherein, one of the via holes is located in a focus of a corresponding one of the convex lenses.

9. The display apparatus according to claim 7, wherein, a projection of one of the convex lenses on the flexible substrate is a hexagon.

10. The display apparatus according to claim 6, wherein, the fingerprint recognition component further comprises: an optical clear adhesive between the collimating structure and the optical filter film.

11. The display apparatus according to claim 6, wherein, the fingerprint recognition component has a fingerprint recognition area, and a border area on a periphery of the fingerprint recognition area; and
    the fingerprint recognition component further comprises:
        a frame adhesive on a side of the collimating structure facing the display panel, wherein the frame adhesive is located in the border area.

12. The display apparatus according to claim 1, wherein, the fingerprint recognition component further comprises: a double-sided adhesive tape between the flexible heat dissipation component and the fingerprint recognition component, and the flexible heat dissipation component and the fingerprint recognition component are bonded through the double-sided adhesive tape.

13. The display apparatus according to claim 1, wherein, a projection of the first portion on the display surface is a rectangle, having a first side edge and a second side edge which are opposite, and a third side edge and a fourth side edge which are opposite; wherein the first side edge is bonded with a first chip on film, and the fourth side edge is bonded with a second chip on film; and the second portion comprises a first sub-heat dissipation portion extending from the second side edge, and a second sub-heat dissipation portion extending from the third side edge.

14. The display apparatus according to claim 13, wherein, the first chip on film is provided with a fingerprint recognition chip; and the second chip on film is provided with a gate driving chip; and the second chip on film is further bonded with a flexible circuit board.

15. The display apparatus according to claim 1, wherein, an area of the flexible fingerprint recognition member accounts for 40%-70% of an area of the display panel.

16. A method for fabricating the display apparatus according to claim 1, comprising:

forming the flexible fingerprint recognition member; and attaching the flexible fingerprint recognition member to the opening area of the heat dissipation film on the back surface of the display panel; wherein forming the flexible fingerprint recognition member, comprises:

forming the fingerprint recognition component on a rigid substrate;

stripping off the rigid substrate; and attaching the flexible heat dissipation component to the side of the fingerprint recognition component facing away from the display panel.

17. The fabricating method according to claim 16, wherein, forming the fingerprint recognition component on the rigid substrate comprises:

forming a functional layer on a bonding structure, wherein, the bonding structure comprises the rigid substrate, and a flexible substrate bonded to the rigid substrate;

forming an optical filter film on a side of the functional layer facing away from the flexible substrate;

bonding a collimating structure to a side of the optical filter film facing away from the flexible substrate through an optical clear adhesive; and bonding a first chip on film and a second chip on film.

\* \* \* \* \*